(12) United States Patent
Kitagawa et al.

(10) Patent No.: US 9,183,965 B2
(45) Date of Patent: Nov. 10, 2015

(54) CONDUCTIVE HARD CARBON FILM AND METHOD FOR FORMING THE SAME

(75) Inventors: Teruyuki Kitagawa, Himeji (JP); Shuhei Nomura, Himeji (JP)

(73) Assignee: NOMURA PLATING CO., LTD., Osaka (JP)

( * ) Notice: Subject to any disclaimer, the term of this patent is extended or adjusted under 35 U.S.C. 154(b) by 167 days.

(21) Appl. No.: 13/885,623

(22) PCT Filed: Nov. 28, 2011

(86) PCT No.: PCT/JP2011/077333
§ 371 (c)(1), (2), (4) Date: May 29, 2013

(87) PCT Pub. No.: WO2012/073869
PCT Pub. Date: Jun. 7, 2012

(65) Prior Publication Data
US 2015/0037568 A1    Feb. 5, 2015

(30) Foreign Application Priority Data
Nov. 30, 2010   (JP) .................................. 2010-266837

(51) Int. Cl.
*C23C 14/06*   (2006.01)
*H01B 1/04*   (2006.01)
(Continued)

(52) U.S. Cl.
CPC ...... *H01B 1/04* (2013.01); *C01B 31/02* (2013.01); *C23C 14/022* (2013.01); *C23C 14/024* (2013.01); *C23C 14/0605* (2013.01);
(Continued)

(58) Field of Classification Search
USPC ........... 427/577; 428/336, 408, 698; 204/192, 204/192.1, 192.11, 192.15
See application file for complete search history.

(56) References Cited

U.S. PATENT DOCUMENTS 5,202,156 A * 4/1993 Yamamoto et al. ........... 427/577
5,401,543 A * 3/1995 O'Neill et al. ........... 204/192.38
(Continued)

FOREIGN PATENT DOCUMENTS

JP    63-126234     5/1988
JP    2000256850 A  9/2000
(Continued)

OTHER PUBLICATIONS

International Search Report in corresponding PCT/JP2011/077333 mailed Mar. 19, 2012.
(Continued)

*Primary Examiner* — Archene Turner
(74) *Attorney, Agent, or Firm* — Marshall, Gerstein & Borun LLP

(57) ABSTRACT

A film is formed under vacuum by a step of purifying and/or flattening the base material (13) by irradiating the base material (13) with a gas cluster ion beam (4a); by a step of forming an intermediate layer film by evaporating/vaporizing an intermediate layer film forming material, allowing the evaporated/vaporized material to adhere to the surface of the base material (13), and irradiating the intermediate layer film forming material with a gas cluster ion beam (4a); and by evaporating/vaporizing a carbon film forming material containing a carbonaceous material containing substantially no hydrogen, and a boron material, allowing the evaporated/vaporized material to adhere to the surface of the intermediate layer film, and irradiating the carbon film forming material with a gas cluster ion beam (4a).

5 Claims, 2 Drawing Sheets

(51) Int. Cl.
  *C23C 14/02*  (2006.01)
  *C23C 14/22*  (2006.01)
  *C01B 31/02*  (2006.01)
  *C23C 14/34*  (2006.01)
  *G01R 1/067*  (2006.01)

(52) U.S. Cl.
  CPC ............... *C23C14/22* (2013.01); *C23C 14/221* (2013.01); *C23C 14/3442* (2013.01); *G01R 1/067* (2013.01); *Y10T 428/31678* (2015.04)

(56) References Cited

U.S. PATENT DOCUMENTS

| | | | | |
|---|---|---|---|---|
| 7,431,988 | B2* | 10/2008 | Hanyu et al. | 428/408 |
| 7,458,585 | B2* | 12/2008 | Hamada et al. | 428/408 |
| 7,887,919 | B2* | 2/2011 | Yamamoto et al. | 428/698 |
| 2003/0026990 | A1* | 2/2003 | Yamada et al. | 428/408 |
| 2007/0224349 | A1* | 9/2007 | Hosenfeldt et al. | 428/688 |

FOREIGN PATENT DOCUMENTS

| | | | |
|---|---|---|---|
| JP | 2001192807 | A | 7/2001 |
| JP | 2004149838 | A | 5/2004 |
| JP | 2004217975 | A | 8/2004 |
| JP | 2005169816 | A | 6/2005 |
| JP | 2006-057674 | * | 3/2006 |
| JP | 2008-297477 | * | 12/2008 |
| JP | 2009280421 | A | 12/2009 |
| JP | 2010024476 | A | 2/2010 |
| WO | WO-2008133156 | A1 | 11/2008 |

OTHER PUBLICATIONS

Kitagawa et al., "Hard DLC film formation by gas cluster ion beam assisted deposition," *Nucl. Instr. and Meth. in Phys. Res.*, 201: 405-412 (2003).

International Preliminary Report on Patentability in corresponding PCT/JP2011/077333 dated Jun. 4, 2013. (English Translation).

* cited by examiner

CONDUCTIVE HARD CARBON FILM AND METHOD FOR FORMING THE SAME

TECHNICAL FIELD

The present invention relates to a conductive hard carbon film which is applicable to various kinds of members required to have conductivity, abrasion resistance and heat resistance, and a method for forming the same. In particular, the present invention relates to a conductive hard carbon film suitable for surface treatment applied to probes for use in measurement of electrical properties of semiconductors and electronic component materials, surface treatment applied to separators to be placed between the anode and cathode of fuel cells, and surface treatment applied to cathode electron emission elements.

BACKGROUND ART

In recent years, conductive diamond-like carbon (DLC) has been used for probes for measuring electric properties of semiconductors and various kinds of electronic component materials. Previously used were probes in which a base material made of beryllium copper was plated with gold, but such probes had the following problems.

1) During the measurement of electrical properties of semiconductors or electronic components, the solder on the electrodes thereof is brought into repeated contact with a probe and adheres to the surface of the probe, changing the contact resistance. Consequently, inspection results vary and therefore stable quality cannot be ensured.

2) Abrasion resistance of the base material for probes is insufficient and therefore frequent probe replacement is required. Consequently, frequent gold plating is also required, which results in higher costs, and the time required for probe replacement results in a decreased productivity.

To solve the above problems, conductive DLC was developed, and prevention of solder debris and improvement of abrasion resistance have been pursued (e.g. see Patent Literature 1 and Patent Literature 2).

Solder debris on the surface of probes is mainly associated with the surface free energy of materials thereof. Use of an organic carbon film instead of gold can reduce the surface free energy and as a result reduces the possibility of solder adhesion to the surface of probes.

Meanwhile, it is not easy to achieve both hardness and conductivity. To make a carbon film harder, cubic diamond component in the carbon film needs to be increased. However, carbon containing increased diamond component exhibits insulation. To improve conductivity, graphite component in the carbon film needs to be increased. However, a carbon film containing increased graphite component is extremely soft (since the hardness of graphite is 0.1 GPa or less). Thus, hardness and conductivity are not compatible, and therefore it is not easy to achieve both hardness and conductivity.

Hence, thin films having conductivity and a certain level of hardness due to impurities, such as boron, doped in DLC have been applied in the above technical field (e.g. see Patent Literature 3). Conductive DLC films currently used as coated films of probes have hardness in the range of 9 to 30 GPa and volume resistivity in the range of $1\times10^{-4}$ to $1\times10^{2}$ Ω·cm.

However, due to miniaturization of components and increase in the speed of production lines in the process of manufacturing semiconductors and electronic components, DLC films are currently required to have the following properties: 1) higher hardness (abrasion resistance) and not higher volume resistivity than those of existing conductive DLC films; and 2) stability in terms of volume resistivity and hardness even in a high temperature range around 200° C.

CITATION LIST

Patent Literature

Patent Literature 1: JP 2004-217975 A
Patent Literature 2: JP 2010-24476 A
Patent Literature 3: WO2008/133156

SUMMARY OF INVENTION

Technical Problem

The present invention was achieved in view of the above problems of conventional conductive DLC films. Therefore, the object of the present invention is to provide a conductive hard carbon film which has higher hardness and not higher volume resistivity as compared to existing conductive DLC films as well as stability in terms of volume resistivity and hardness even in a high temperature range around 200° C., and a method for forming the same.

Solution to Problem

To achieve the above object, the present inventors have wholeheartedly continued investigations and finally completed the present invention. The present invention is configured as follows.

1) Method for Vapor-Phase Film Formation by Irradiation of Gas Cluster Ion Beam Under Vacuum and Conductive Hard Carbon Film Formed by the Method A first method for forming a conductive hard carbon film is a method for vapor-phase formation of a conductive hard carbon film on a base material under vacuum, the method comprising a step of purifying and/or flattening the base material by irradiating the base material with a gas cluster ion beam; and a step of evaporating/vaporizing a carbon film forming material containing a carbonaceous material containing substantially no hydrogen, and a boron material, allowing the evaporated/vaporized material, which is optionally ionized, to adhere to the surface of the base material, and irradiating the carbon film forming material with a gas cluster ion beam for film formation.

A second method for forming a conductive hard carbon film is a method for vapor-phase formation of a conductive hard carbon film on a base material under vacuum, the method comprising a step of purifying and/or flattening the base material by irradiating the base material with a gas cluster ion beam; a step of forming an intermediate layer film by evaporating/vaporizing an intermediate layer film forming material, allowing the evaporated/vaporized material, which is optionally ionized, to adhere to the surface of the base material, and irradiating the intermediate layer film forming material with a gas cluster ion beam; and a step of evaporating/vaporizing a carbon film forming material containing a carbonaceous material containing substantially no hydrogen, and a boron material, allowing the evaporated/vaporized material, which is optionally ionized, to adhere to the surface of the intermediate layer film, and irradiating the carbon film forming material with a gas cluster ion beam for film formation.

The conductive hard carbon film manufactured by either of the above methods is characterized by having indentation hardness of 35 to 60 GPa and volume resistivity of $1.0\times10^{-4}$ to $1.0\times10^0$ Ω·cm. The carbonaceous material is preferably a substance which forms clusters when evaporated.

The gas cluster is preferably composed of atoms or molecules of at least one kind selected from rare gas, carbon oxide, nitrogen and nitride.

2) Conductive Hard Carbon Film Having Excellent Hardness and Conductivity

The conductive hard carbon film according to the present invention is characterized by containing substantially no hydrogen, and the method for manufacturing the same is not limited to a method using a gas cluster ion beam.

When the amount of hydrogen contained in the conductive hard carbon film exceeds a certain amount, the ratio of diamond bond component decreases, resulting in reduction in hardness. However, a trace amount (1 atom % or less) of hydrogen, which is inevitably contained in the conductive hard carbon film, does not cause reduction in hardness. That is, the conductive hard carbon film of the present invention is made of a base material and a carbon film formed on the base material, contains substantially no hydrogen and 0.01 to 5 atom % of boron, and has indentation hardness of 35 to 60 GPa and volume resistivity of $1.0\times10^{-4}$ to $1.0\times10^0$ Ω·cm.

For better adhesion between the carbon film and the base material, an intermediate layer film is preferably formed between the carbon film and the base material. The material for forming the intermediate layer film preferably contains at least one kind selected from silicon, chromium, tungsten, titanium, molybdenum and a carbide or nitride thereof.

The film forming apparatus for the conductive hard carbon film is an apparatus for vapor-phase formation of a conductive hard carbon film on a base material under vacuum, the apparatus comprising a gas cluster generation unit, a gas cluster ionization unit, a gas cluster ion acceleration unit, a unit for generating evaporated particles of a carbon film forming material, a unit for ionizing/accelerating the evaporated particles of the carbon film forming material, a means for supplying evaporated particles of a boron material, and an optional unit for generating evaporated particles of an intermediate layer film forming material.

Advantageous Effects of Invention

According to the present invention, it is possible to form a conductive hard carbon film having volume resistivity of $1.0\times10^{-4}$ to $1.0\times10^0$ Ω·cm, i.e. conductivity not less than that of conventional conducive DLC films, and hardness of 35 to 60 GPa, which is higher than that of conventional DLC films. In addition, the conductive hard carbon film of the present invention exhibits stable volume resistivity and hardness even in a high temperature range around 200° C.

The process of forming existing conductive DLC films involves strong hydrogen-containing plasma irradiation, in which process the base material is heated to about 200° C. due to the temperature generated by the plasma. In contrast, the gas cluster process in the present invention does not use plasma generated by discharge or a carbonaceous material containing hydrogen. Appropriate gas cluster ion irradiation performed in this process can form a conductive carbon film having a large amount of diamond bond component and as a result high hardness without raising the temperature of the base material above 100° C. Accordingly, the present invention is also applicable to a base material made of, for example plastic, of which material properties change at high temperature of 100° C. or higher.

Using the conductive hard carbon film of the present invention, problems of existing conductive DLC films can be solved all at once. Therefore, the present invention can greatly contribute to the development in the fields of surface treatment applied to probes for use in measurement of electrical properties of semiconductors and electronic component materials, surface treatment applied to separators to be placed between the anode and cathode of fuel cells, and surface treatment applied to cathode electron emission elements.

REFERENCE SIGNS LIST

Figure 1:
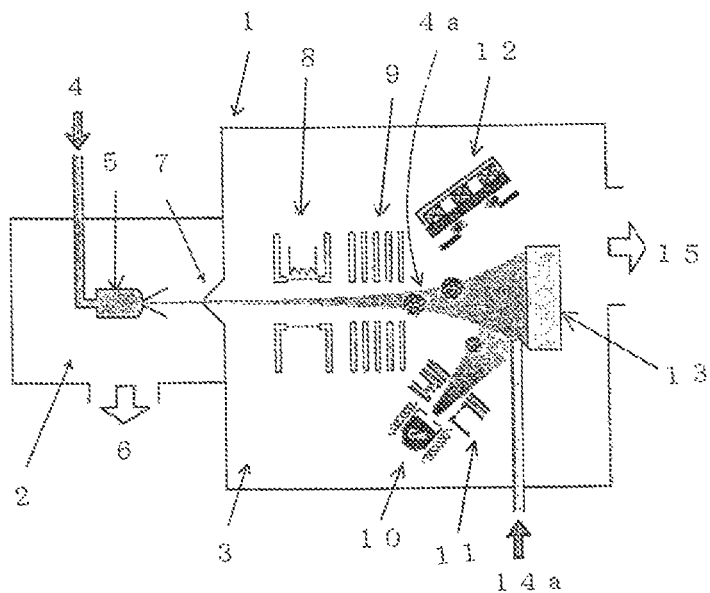
FIG. 1 shows a film forming apparatus for conductive hard carbon films, in which a gas cluster generation unit and a processing unit using gas cluster ions are provided in a vacuum vessel. The schematic view shows an example of a film forming apparatus for conductive hard carbon films, the apparatus comprising, in the processing unit using gas cluster ions, a unit for generating evaporated particles of a carbonaceous material and a unit for ionizing/accelerating the evaporated particles, a port for supplying evaporated particles of a boron material in the vicinity of a base material, and a unit for generating evaporated particles of an intermediate layer film forming material.

1 Vacuum vessel
2 Gas cluster generation unit
3 Processing unit using gas cluster ions
4 Cluster gas
4a Gas cluster ion beam
5 Nozzle
6 Evacuation to vacuum
7 Skimmer
8 Gas cluster ionization unit
9 Gas cluster ion acceleration unit
10 Unit for generating evaporated particles of carbonaceous material
11 Unit for ionizing/accelerating evaporated particles of carbonaceous material
12 Unit for generating evaporated particles of intermediate layer film forming material
13 Base material
14a, 14b, 14c Port for supplying evaporated particles of a boron material
15 Evacuation to vacuum

DESCRIPTION OF EMBODIMENTS

As described above, the present invention is characterized by supplying a carbon film forming material containing a carbonaceous material containing substantially no hydrogen, and a boron material to a base material and by forming a conductive hard carbon film on the base material using a gas cluster ion beam. Further, as will be described below, the present invention comprises a step of purifying and/or flattening the base material, and a step of forming a conductive hard carbon film, and preferably further comprises a step of forming an intermediate layer film, and film formation performed by irradiating an intermediate layer film forming material and/or a carbon film forming material with a gas cluster ion beam is an important element.

The conductive hard carbon film of the present invention is also characterized by containing substantially no hydrogen and the method for manufacturing the same is not limited to a method using a gas cluster ion beam.

Step of Purifying and/or Flattening Base Material
[Step of Purifying Base Material]

A base material can be purified by irradiating the base material with a gas cluster ion beam generated by ionization of gas clusters as groups of atoms or molecules of a substance which is gaseous under normal temperatures and pressures. The atoms or molecules constituting such gas clusters used for the purpose of base material purification may be any atoms or molecules which are usually gaseous under conditions of normal temperatures and pressures, and any atoms or molecules suitable for gas cluster generation can be used without particular limitation. The gas to be clusters is preferably one kind of gas selected from rare gases, such as argon, helium, and neon; carbon oxides, such as CO and $CO_2$; nitrogen and nitride, such as $N_2O$, NO, $N_2O_3$, $NO_2$ and $N_2H_4$; or a mixed gas made of at least two kinds selected therefrom.

Gas clusters in the gas cluster ion beam are usually generated from a cluster gas. Specifically, when a cluster gas is ejected from a nozzle for cluster generation under vacuum, the cluster gas is cooled by adiabatic expansion and the aforementioned atoms or molecules are condensed, whereby gas clusters are generated.

The number of atoms or molecules composing a gas cluster (i.e. cluster size) is not particularly limited but preferably in the range of 10 to 200000 (the average number of molecules is 500 to 2000) and more preferably in the range of 10 to 100000. The cluster size distribution can be selected as appropriate depending on the pressure and temperature of the gas and the size and shape of the nozzle for gas cluster generation.

Gas clusters are ionized by a known means for irradiation of ionized radiation, such as electron beam irradiation. Subsequently, the ionized particles are given energy (e.g. by a high voltage) and thereby accelerated. Thus, a gas cluster ion beam is generated. The acceleration voltage to generate the gas cluster ion beam is preferably in the range of 1 to 100 kV and more preferably in the range of 1 to 50 kV.

The irradiation of the gas cluster ion beam for purification may be continuous or intermittent. By this purification, adhesiveness of the intermediate layer film to the base material can be improved.

In the present invention, purification of the base material means a treatment of scraping away a very limited amount of the outermost layer part of the base material thinly in the thickness direction for removing debris or undesired substances such as a foreign matter on the surface of the base material. Flattening of the base material, which will be described later, means a treatment of scraping away an amount of the outermost layer part of the base material, the amount scraped away being more than that in purification (deeper in the thickness direction), for removing unevenness of the surface. Depending on the type and surface conditions of the base material, purification or flattening alone, purification and subsequent flattening, or flattening and subsequent purification may be performed.

[Step of Flattening Base Material]

A base material can be flattened by irradiating the base material with a gas cluster ion beam. The type of gas constituting the gas clusters used for the purpose of base material flattening, the process of generating the gas clusters, the cluster size, the process of generating the gas cluster ion beam are as described above and duplicated explanation thereof is not given here. Within the above ranges, the type of the cluster gas for flattening, the cluster size, and the cluster size distribution may be the same as or different from those in the purification step. The irradiation of the gas cluster ion beam for flattening may be continuous or intermittent. However, regarding the voltage for accelerating gas cluster ions, preferable ranges are different between flattening and purification. As stated above, the amount to be scraped away from the outermost layer part of the base material is larger in flattening than in purification and therefore the acceleration voltage for generating the gas cluster ion beam is preferably higher in flattening than in purification. The acceleration voltage is preferably in the range of 10 to 200 kV, more preferably in the range of 10 to 100 kV, unlike in purification. As a result of this flattening treatment, the flatness of the conductive hard carbon film coated on the base material will be improved, resulting in resistance against adhesion of debris such as solder.

(2) Step of Forming Intermediate Layer Film

An intermediate layer film can be formed by allowing an intermediate layer film forming material as it is to adhere to the surface of the base material and subsequently irradiating the intermediate layer film forming material with a gas cluster ion beam. It is also possible, however, to form an intermediate layer film by evaporating/vaporizing an intermediate layer film forming material under vacuum, allowing the evaporated/vaporized material, which is optionally ionized, to adhere to the surface of the base material, and subsequently irradiating the intermediate layer film forming material with a gas cluster ion beam.

Examples of the intermediate layer film forming material include Si, SiC, $Si_3N_4$, Cr, $Cr_3C_2$, CrC, CrN, W, WC, WN, $WN_2$, Ti, TiC, TiN, Mo, MoC, $Mo_2C$ and $Mo_2N$ or a mixture thereof.

Examples of the means for evaporating/vaporizing the intermediate layer film forming material include known means, such as sputtering, laser ablation, ion beam, electron beam, and crucible heating. Examples of the means for ionizing the intermediate layer film forming material include known means, such as electron impact ionization (EI), desorption electron ionization (DEI), field ionization (FI), and photoionization.

Conditions for the intermediate layer film formation include the degree of vacuum at the time of film formation, the temperature of the base material at the time of film formation, the ratio of the number of the atoms or molecules of the evaporated particles or ionized particles of the intermediate layer film forming material to the number of gas cluster ions, and the voltage for accelerating gas cluster ions, and these conditions can be determined as appropriate considering the type of the intermediate layer film forming material, the properties of the intermediate layer film, the film formation speed, etc.

The type of gas constituting the gas clusters used in the step of intermediate layer film formation, the process of generating the gas clusters, the cluster size, the process of generating the gas cluster ion beam are as described above and duplicated explanation thereof is not given here. Within the above ranges, the type of the cluster gas for intermediate layer film formation, the cluster size, the cluster size distribution, and the voltage for accelerating gas cluster ions may be the same as or different from those in the purification step or the flattening step. The irradiation of the gas cluster ion beam for intermediate layer film formation may be continuous or intermittent.

It is particularly preferred that the ratio of the number of atoms or molecules of evaporated particles or ionized particles of the intermediate layer film forming material to the number of gas cluster ions is determined so that, for example, 1 to 5000 molecules constituting the gas clusters of the intermediate layer film forming material exist relative to 1 to 10 gas cluster ions (i.e. the average number of molecules per gas cluster is 1000 or more).

Since high temperature and high pressure conditions are locally and instantaneously provided when gas cluster ions collide against the base material, it is possible, without the need of heating the base material, to form an intermediate layer film which is dense and stable (i.e. the properties of the film do not change over time) under normal temperatures. Needless to say, the base material may be heated within the range where the object of the present invention is not hampered. The adhesiveness between the carbon film and the base material can be improved by forming such an intermediate layer film between the carbon film and the base material.

For better adhesion between the intermediate layer film and the carbon film, the intermediate layer is preferably a mixed layer as a mixture of the intermediate layer film forming material and the carbon film forming material. For further better adhesion between the intermediate layer film and the carbon film, the mixed layer may have a gradient component composition such that the content of the carbon film forming material increases in the direction from the base material to the carbon film and the content of the intermediate layer film forming material decreases in the same direction.

(3) Step of Forming Conductive Hard Carbon Film

A conductive hard carbon film can be formed on the intermediate layer film by, under vacuum, evaporating/vaporizing a carbon film forming material containing a carbonaceous material containing substantially no hydrogen, and a boron material, allowing the evaporated/vaporized material, which is optionally ionized, to adhere to the surface of the base material, and irradiating the carbon film forming material with a gas cluster ion beam.

Examples of the carbonaceous material include various kinds of carbon materials excluding diamond. Specific examples thereof include at least one kind selected from fullerene, carbon nanotubes, graphite, amorphous carbon and carbine containing no hydrogen. For sustainable heat resistance of the carbon film, these carbonaceous materials preferably contain no hydrogen or impurities. Inter alia, fullerene, carbon nanotubes, and homologs thereof are preferred.

Examples of the boron material include at least one kind selected from trimethoxy boron, diborane, decaborane and octadecaborane, and preferred are boron materials having 1 to 18 boron atoms. More preferred are at least one kind selected from borohydrides, such as diborane, decaborane and octadecaborane, and more preferred are borohydrides having 2 to 18 boron atoms.

Examples of the means for evaporating/vaporizing the carbon film forming material include known means, such as sputtering, laser ablation, ion beam, electron beam, and crucible heating. Examples of the means for ionizing the carbon film forming material include known means, such as electron impact ionization (EI), desorption electron ionization (DEI), field ionization (FI), and photoionization.

Conditions for the carbon film formation include the degree of vacuum at the time of film formation, the temperature of the base material at the time of film formation, the ratio of the number of the atoms or molecules of the evaporated particles or ionized particles of the carbon film forming material to the number of gas cluster ions, and the voltage for accelerating gas cluster ions, and these conditions can be determined as appropriate considering the type of the carbon film forming material, the properties of the carbon film, the film formation speed, etc.

The type of gas constituting the gas clusters used in the step of conductive hard carbon film formation, the process of generating the gas clusters, the cluster size, the process of generating the gas cluster ion beam are as described above and duplicated explanation thereof is not given here. Within the above ranges, the type of the cluster gas for conductive hard carbon film formation, the cluster size, the cluster size distribution, and the voltage for accelerating gas cluster ions may be the same as or different from those in the purification step, the flattening step, or the intermediate layer film formation step. The irradiation of the gas cluster ion beam for conductive hard carbon film formation may be continuous or intermittent.

It is preferred that the ratio of the number of atoms or molecules of evaporated particles or ionized particles of the carbon film forming material to the number of gas cluster ions is determined so that, for example, relative to 1000 atoms of the carbonaceous material constituting the gas clusters of the carbon film forming material, 0.1 to 5 atoms of the boron material and 1 to 10 gas cluster ions exist.

Since high temperature and high pressure conditions are locally and instantaneously provided when gas cluster ions collide against the base material, it is possible, without the need of heating the base material, to form a conductive hard carbon film which is dense and stable (i.e. the properties of the film do not change over time) under normal temperatures. Needless to say, the base material may be heated within the range where the object of the present invention is not hampered.

The conductive hard carbon film of the present invention is not particularly limited as long as it is excellent in conductivity and abrasion resistance but preferably has a film thickness of 0.1 nm to 10 μm, more preferably 5.0 μm or less, and further preferably 0.1 nm to 2 μm.

The intermediate layer preferably has a film thickness of 0.05 to 0.5 μm, and more preferably 0.05 to 0.2 μm.

The conductive hard carbon film obtained as stated above has indentation hardness of 35 GPa or more and volume resistivity of $1.0 \times 10^0$ Ω·cm or less.

The film forming apparatuses shown below were used for film formation of the conductive hard carbon film of the present invention, but of course other film forming apparatuses may be used as long as a conductive hard carbon film having the properties of the present invention can be obtained therewith.

(4) Film Forming Apparatus for Conductive Hard Carbon Film

The apparatuses used for forming the conductive hard carbon film were those for vapor-phase formation of a conductive hard carbon film on a base material under vacuum, the apparatuses each comprising a gas cluster generation unit, a gas cluster ionization unit, a gas cluster ion acceleration unit, a unit for generating evaporated particles of an intermediate layer film forming material a unit for generating evaporated particles of a carbon film forming material, a unit for ionizing/accelerating the evaporated particles of the carbon film forming material, and a means for supplying evaporated particles of a boron material. In the cases where the intermediate layer film is not formed, the unit for generating evaporated particles of an intermediate layer forming material is not required.

The film forming apparatus for the conductive hard carbon film will be specifically explained below using FIG. 1 to FIG. 3.

The apparatus shown in FIG. 1 has a gas cluster generation unit (2) and a processing unit using gas cluster ions (3) in a vacuum vessel (1). The gas cluster generation unit (2) has a means for supplying a cluster gas (4), a nozzle (5) and a means for evacuation to vacuum (6), and a skimmer (7) for separating off non-cluster part of the gas at the inlet of the processing unit using gas cluster ions (3). In the processing unit using gas cluster ions (3), a gas cluster ionization unit (8) and a gas cluster ion acceleration unit (9) are arranged. The processing unit using gas cluster ions (3) also has a unit for generating evaporated particles of carbonaceous material (10), a unit for ionizing/accelerating evaporated particles of carbonaceous material (11), a unit for generating evaporated particles of intermediate layer film forming material (12), and a supply port (14a) for supplying evaporated particles of a boron material in the vicinity of a base material (13) supported by a holder (not shown). Since the port (14a) for supplying evaporated particles of a boron material is provided in the vicinity of the base material (13), it is possible to make a boron material adhere to the base material efficiently. The processing unit using gas cluster ions (3) also has a means for evacuation to vacuum (15).

Figure 2:
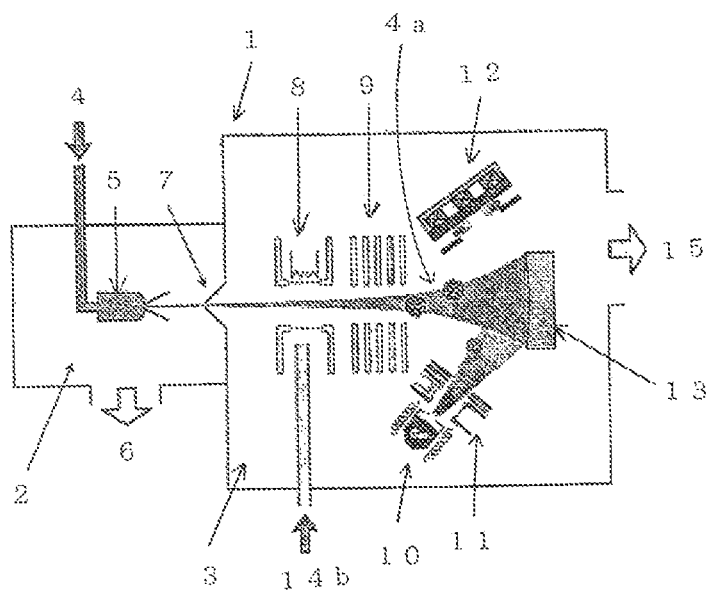
FIG. 2 shows a film forming apparatus for conductive hard carbon films, in which a gas cluster generation unit and a processing unit using gas cluster ions are provided in a vacuum vessel. The schematic view shows an example of a film forming apparatus for conductive hard carbon films, the apparatus comprising, in the processing unit using gas cluster ions, a port for supplying evaporated particles of a boron material in the vicinity of a unit for ionizing gas clusters, and having a mechanism enabling ionization, acceleration and irradiation of the boron material together with gas clusters.

The apparatus shown in FIG. 2 differs from the apparatus of FIG. 1 in that a supply port (14b) for supplying evaporated particles of a boron material is provided in the gas cluster ionization part (8). Using the apparatus of FIG. 2, evaporated particles of a boron material are ionized at the same time as the ionization of gas clusters, and accelerated toward the base material (13) for irradiation. As a result, the boron material can be mixed into the carbon film at a high degree of efficiency. In FIG. 2, the same members as those in FIG. 1 are given the same reference numbers, and duplicated explanation thereof is not given here.

Figure 3:
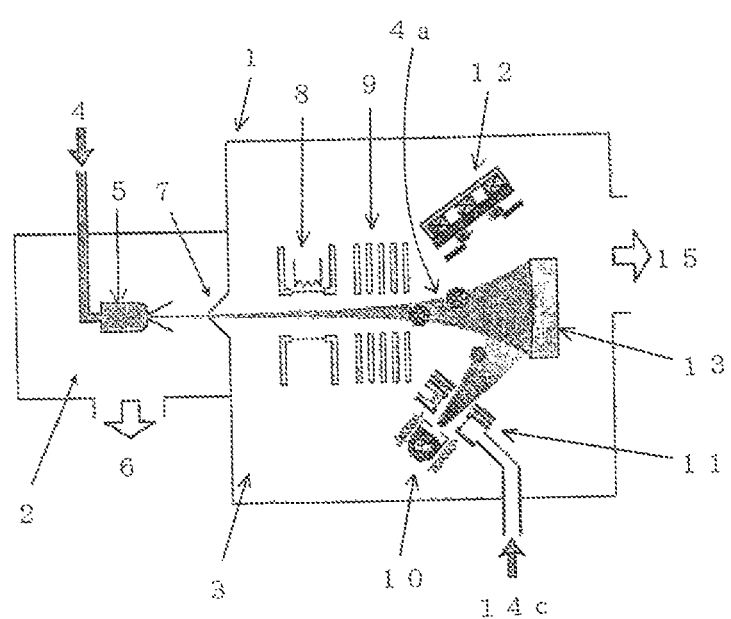
FIG. 3 shows a film forming apparatus for conductive hard carbon films, in which a gas cluster generation unit and a processing unit using gas cluster ions are provided in a vacuum vessel. The schematic view shows an example of a film forming apparatus for conductive hard carbon films, the apparatus comprising, in the processing unit using gas cluster ions, a port for supplying evaporated particles of a boron material in the vicinity of a unit for ionizing/accelerating evaporated particles of carbonaceous material, and having a mechanism enabling ionization, acceleration and irradiation of the boron material together with a carbonaceous material.

The apparatus shown in FIG. 3 differs from the apparatus of FIG. 1 in that a supply port (14c) for supplying evaporated particles of a boron material is provided in the unit for ionizing/accelerating evaporated particles of a carbonaceous material (11). Using the apparatus of FIG. 3, evaporated particles of a boron material are ionized at the same time as the ionization of evaporated particles of the carbonaceous material, and accelerated toward the base material (13) for irradiation. As a result, the boron material can be mixed into the carbon film at a high degree of efficiency. In FIG. 3, the same members as those in FIG. 1 are given the same reference numbers, and duplicated explanation thereof is not given here.

Next, the apparatuses shown in FIG. 1 to FIG. 3 will be specifically explained.

The pressure in the vacuum vessel (1) is reduced to vacuum by the means for evacuation to vacuum (6). The cluster gas (4) is supplied through the nozzle (5) into the gas cluster generation unit (2) under vacuum, and the energy of atoms or molecules of the cluster gas is converted into translational energy and at the same time, due to adiabatic expansion, converted into kinetic energy in the direction of expansion. Due to adiabatic expansion, the atoms or molecules of the cluster gas lose energy, are excessively cooled, and by an intermolecular force, are coupled to each other to form gas clusters. The thus generated gas clusters are guided through the skimmer (7) to the gas cluster ionization unit (8) and the gas cluster ion acceleration unit (9) for ionization by electron impact and subsequent acceleration. The ionized and accelerated gas clusters are directed to the base material (13) arranged in the processing unit (3). In the present invention, the gas cluster ion beam (4a) directed to the base material may be scanned by a deflection unit (not shown).

Also, a high-density intermediate layer film with a strong adhesion force to the base material can be formed by evaporating/vaporizing an intermediate layer film forming material using the unit for generating evaporated particles of intermediate layer film forming material (12) (e.g. sputter deposition mechanism), allowing the evaporated particles of the intermediate layer film forming material to adhere to the base material (13) arranged in the processing unit (3), and at the same time irradiating the base material with a gas cluster ion beam.

After the intermediate layer film is formed, a conductive hard carbon film is formed on the intermediate layer film by allowing adhesion of evaporated particles of a carbonaceous material, adhesion of evaporated particles of a boron material, and irradiation of a gas cluster ion beam at the same time onto the base material. This will be explained below.

That is, a carbonaceous material can be made to adhere to the intermediate layer film formed on the surface of the base material (13) by evaporating/vaporizing a carbonaceous material using the unit for generating evaporated particles of carbonaceous material (10) (e.g. crucible and crucible heating heater), guiding the evaporated particles of the carbonaceous material to the unit for ionizing/accelerating evaporated particles of carbonaceous material (11) for ionization by electron impact, and accelerating the ionized and evaporated particles of the carbonaceous material for irradiation of the base material (13) arranged in the processing unit (3).

For the adhesion of a carbonaceous material, evaporated particles of a boron material are made to adhere at the same time by any of the supply means shown in the apparatuses in FIGS. 1, 2 and 3. The apparatus shown in FIG. 1 has the supply port (14a) for supplying evaporated particles of a boron material in the vicinity of the base material (13) and therefore a boron material can adhere to the base material (13) efficiently. The apparatus shown in FIG. 2 has the supply port (14b) for supplying evaporated particles of a boron material in the gas cluster ionization unit (8) and therefore evaporated particles of a boron material are ionized at the same time as the ionization of gas clusters, and accelerated toward the base material (13) for irradiation. As a result, the boron material can be mixed into the carbon film at a high degree of efficiency. The apparatus shown in FIG. 3 has the supply port (14c) for supplying evaporated particles of a boron material in the unit for ionizing/accelerating evaporated particles of carbonaceous material (11) and therefore evaporated particles of a boron material are ionized at the same time as the ionization of evaporated particles of the carbonaceous material, and accelerated toward the base material (13) for irradiation. As a result, the boron material can be mixed into the carbon film at a high degree of efficiency.

As stated above, gas cluster ions for use in flattening and purifying the base material and gas cluster ions for use in formation of the conductive hard carbon film and the intermediate layer film can be obtained from the same source, and therefore each step can be continuously performed in the same vacuum vessel.

EXAMPLES

Examples of the present invention will be given below but the present invention is not limited thereto. Modifications and applications can be made as appropriate in a range within the technical scope of the present invention.

Example 1

A 50 mm×50 mm square silicon wafer was used as the base material (13). This silicon wafer was set in the apparatus shown in FIG. 1 and irradiated, for purification of the surface of the silicon wafer, with argon cluster ions at $5×10^{16}$ clusters/$cm^2$, the cluster ions having the average argon atom number of 1000 and being accelerated at 20 kV. The number of argon atoms composing one cluster was measured by the time-of-flight method. The argon cluster ions were generated using the cluster generation nozzle (5) made of glass, introduced to the processing unit using gas cluster ions (3) through the skimmer (7), and ionized by electron impact in the ionization unit (8) so as to collide against the surface of the silicon wafer (13).

After the surface of the silicon wafer was purified, fullerene was evaporated in a crucible to give evaporated particles of a carbonaceous material and at the same time 0.1 sccm of evaporated particles of diborane was supplied as the evaporated particles of a boron material to the vicinity of the silicon wafer (13) by the method shown in FIG. 1 for direct adhesion of the particles onto the silicon wafer (13). Then, argon cluster ions formed under the same conditions as in the above surface purification were accelerated at a voltage of 5 kV for an assisting irradiation of an argon cluster ion beam, whereby formation of a boron-containing carbon film containing substantially no hydrogen was performed on the surface of the silicon wafer (13) until the film thickness reached 1.0 μm. The reason for the absence of hydrogen in the boron-containing carbon film formed on the silicon wafer, despite of the presence of hydrogen in diborane used as the boron material, is as follows. Due to the high temperature and high pressure conditions provided when argon cluster ions collide against the silicon wafer, molecules of diborane (or trimethoxy boron or decaborane, which will be described later) are decomposed to the atomic level. As a result, while boron as a solid component remains in the film, hydrogen as a gas component goes out of the film. Therefore, no or only a very small amount of hydrogen (1 atom % or less, in an amount not adversely affecting the conductivity) remains in the boron-containing carbon film.

Example 2

A sample having a boron-containing carbon film containing substantially no hydrogen was prepared in the same manner as in Example 1 (using evaporated particles of diborane as the evaporated particles of a boron material) except that the apparatus shown in FIG. 2 was used.

Example 3

A sample having a boron-containing carbon film containing substantially no hydrogen was prepared in the same manner as in Example 1 except that trimethoxy boron as the boron material and the apparatus shown in FIG. 2 were used.

Example 4

A sample having a boron-containing carbon film containing substantially no hydrogen was prepared using the apparatus shown in FIG. 1 in the same manner as in Example 1 except that decaborane ($B_{10}H_{14}$) as the boron material was used.

Example 5

A sample having a boron-containing carbon film containing substantially no hydrogen was prepared in the same manner as in Example 1 except that decaborane ($B_{10}H_{14}$) as the boron material and the apparatus shown in FIG. 2 were used.

Example 6

Using the apparatus shown in FIG. 2, after the surface of the silicon wafer was purified with argon cluster ions in the same manner as in Example 1, chromium as an intermediate layer film forming material was evaporated by magnetron sputtering and at the same time argon cluster ions formed under the same conditions as in the above surface purification were accelerated at a voltage of 5 kV for an assisting irradiation of an argon cluster ion beam, whereby formation of an intermediate layer film was performed on the surface of the silicon wafer (13) until the film thickness reached 1.0 μm. The conditions of magnetron sputtering for formation of the intermediate layer film were a DC voltage of 550 V and a DC current of 500 mA.

After the intermediate layer film was formed, fullerene was evaporated in a crucible to give evaporated particles of a carbonaceous material and at the same time 0.1 sccm of evaporated particles of decaborane was supplied as the evaporated particles of a boron material to the gas cluster ionization unit (8) by the method shown in FIG. 2. At the same time as the gas clusters were ionized, the evaporated particles of decaborane were ionized, and argon cluster ions formed under the same conditions as in the above surface purification were accelerated at a voltage of 5 kV for an assisting irradiation of an argon cluster ion beam, whereby formation of a boron-containing carbon film containing substantially no hydrogen was performed on the surface of the intermediate layer film until the film thickness reached 1.0 μm.

Example 7

Using the apparatus shown in FIG. 2, after the surface of the silicon wafer was purified with argon cluster ions in the same manner as in Example 1, chromium as an intermediate layer film forming material was evaporated by magnetron sputtering. At the same time, fullerene was evaporated in a crucible to give evaporated particles of a carbonaceous material and at the same time 0.1 sccm of evaporated particles of decaborane was supplied as the evaporated particles of a boron material to the gas cluster ionization unit (8) by the method shown in FIG. 2. At the same time as the gas clusters were ionized, the evaporated particles of decaborane were ionized, and argon cluster ions formed under the same conditions as in the above surface purification were accelerated at a voltage of 7 kV for an assisting irradiation of an argon cluster ion beam, whereby formation of an intermediate layer film in which chromium and the boron-containing carbon material were mixed at the ratio of 2:1 was performed on the surface of the silicon wafer (13) until the film thickness reached 1.0 μm.

Then, in the same manner as in the Example 6, formation of a boron-containing carbon film having a thickness of 0.1 μm and containing substantially no hydrogen was performed on the intermediate layer film as a mixture of chromium and the boron-containing carbon material.

Example 8

While an intermediate layer film as a mixture of chromium, fullerene and decaborane was formed by simultaneously evaporating these materials and by at the same time performing an assisting irradiation of an argon cluster ion beam in the same manner as in Example 7, the output of evaporated chromium was continuously adjusted so as to be decreased from 100% at the start to 0% at the end of the intermediate layer formation. Meanwhile, the outputs of evaporated fullerene and decaborane were continuously adjusted so as to be increased from 0% at the start to 100% at the end of the intermediate layer formation. Thus, a 0.1 μm-thick intermediate layer film having a gradient component composition such that the content of the boron-containing carbon film forming material increases from 0% by volume at the silicon wafer to 100% by volume at the boron-containing carbon film and the content of the intermediate layer film forming material decreases from 100% by volume to 0% by volume in the same direction.

Then, in the same manner as in the Example 6, formation of a boron-containing carbon film having a thickness of 0.1 μm and containing substantially no hydrogen was performed on the intermediate layer film having the above gradient component composition.

Comparative Example 1

Using the apparatus shown in FIG. 1, a sample having a carbon film was prepared in the same manner as in Example 1 except that no boron material was used and that no intermediate layer film was formed.

Test Example 1

Evaluation of Conductivity

Conductivity (or volume resistivity) was measured with a resistivity meter (model: Loresta-GP) made by Mitsubishi Chemical Corporation for each of the samples obtained in Examples 1 to 8 and Comparative Example 1. The resistance was measured at 5 random spots on the surface of each of 3 samples (15 spots in total), and the average values are shown in Table 1 below.

Test Example 2

Evaluation of Hardness

Nanoindentation hardness was measured with a nanoindentation measurement device (model: TriboScope TS 70) made by Hysitron Corporation for each of the samples obtained in Examples 1 to 8 and Comparative Example 1. In the same manner as in the volume resistivity measurement, the hardness was measured at 5 random spots on the surface of each of 3 samples (15 spots in total), and the average values are shown in Table 1 below.

Test Example 3

Evaluation of Heat Resistance

Each of the samples obtained in Examples 1 to 8 and Comparative Example 1 was heated with an electric furnace in an air atmosphere, and the heat resistance was measured. Test conditions were such that the heating temperature was 250° C. and the heating time was 12 hours. Volume resistivity and hardness of the heated samples were measured in the same manner as in the measurement of the unheated samples. The results are shown in Table 1 below.

Test Example 4

Measurement of Boron Content

The boron content of the boron-containing carbon films of the samples obtained in Examples 1 to 8 and Comparative Example 1 was quantified by the secondary ion mass spectrometry (SIMS). The boron content was obtained by comparison with a standard sample prepared by ion implantation of a predetermined amount of boron into a diamond thin film formed by chemical vapor synthesis. The results are shown in Table 1 below.

Test Example 5

Measurement of Hydrogen Content

The hydrogen content of the boron-containing carbon films of the samples obtained in Examples 1 to 8 and Comparative Example 1 was quantified by the elastic recoil detection analysis (ERDA). The results are shown in Table 1 below.

TABLE 1

| | Before heat test | | | | After heat test | |
|---|---|---|---|---|---|---|
| | Volume resistivity ($\Omega \cdot cm$) | Hardness (GPa) | Boron content (atom %) | Hydrogen content (atom %) | Volume resistivity ($\Omega \cdot cm$) | Hardness (GPa) |
| Example 1 | $1.2 \times 10^{-1}$ | 51 | 0.1 | <0.1 | $1.3 \times 10^{-1}$ | 51 |
| Example 2 | $2.1 \times 10^{-2}$ | 45 | 0.1 | <0.1 | $2.0 \times 10^{-2}$ | 46 |
| Example 3 | $5.5 \times 10^{-2}$ | 44 | 0.1 | <0.1 | $5.7 \times 10^{-2}$ | 43 |
| Example 4 | $8.8 \times 10^{-4}$ | 43 | 0.5 | 0.3 | $9.2 \times 10^{-4}$ | 41 |
| Example 5 | $1.5 \times 10^{-4}$ | 38 | 1.1 | 0.5 | $1.7 \times 10^{-4}$ | 37 |
| Example 6 | $0.8 \times 10^{-4}$ | 39 | 0.9 | 0.4 | $0.9 \times 10^{-4}$ | 39 |
| Example 7 | $1.1 \times 10^{-4}$ | 42 | 0.9 | 0.4 | $1.2 \times 10^{-4}$ | 40 |
| Example 8 | $1.0 \times 10^{-4}$ | 42 | 1.0 | 0.5 | $1.1 \times 10^{-4}$ | 40 |
| Comparative Example 1 | $3.9 \times 10^{10}$ | 55 | 0 | 0 | $3.8 \times 10^{10}$ | 56 |

Table 1 clearly shows that a carbon film containing 0.01 to 5 atom % of, more preferably 0.1 to 1.5 atom % of a boron material (as in Examples 1 to 8 of the present invention, where the hydrogen content in the boron-containing carbon films is extremely small, i.e. 1 atom % or less) has an unprecedented hardness, a reduced volume resistivity, and as a result an improved conductivity. Comparison between Examples 1 and 2 and comparison between Examples 4 and 5 also show that, in order to achieve a reduced volume resistivity, it is desirable to ionize a boron material before adhesion rather than to allow the boron material in the vicinity of the base material to adhere without ionization. Comparison between Examples 1 and 4 and comparison between Example 2 and Examples 3 and 5 also show that, in order to achieve a reduced volume resistivity, decaborane is preferred as the boron material to diborane or trimethoxy boron. That is, as a material for the present invention, a boron material having a large molecular weight (2 or more boron atoms per molecular) is more suitable. Adhesiveness of the conductive hard carbon film and the base material can be improved by forming an intermediate layer film as in Examples 6, 7 and 8. Furthermore, since the volume resistivity and hardness remained unchanged even after heated to 250° C., it was shown that the present invention can provide a conductive hard carbon film having an unprecedented high heat resistance.

INDUSTRIAL APPLICABILITY

The present invention provides a conductive hard carbon film having unprecedented hardness (35 to 60 GPa) and conductivity ($1.0\times10^{-4}$ to $1.0\times10^{0}$ Ωcm), surface resistance against solder debris or the like, and stable volume resistivity and hardness in high temperature range at the level of 200° C., and a method for forming the same. The process of forming conventional conductive DLC films involves strong plasma irradiation, in which process the base material is heated to about 200° C. due to the temperature generated by the plasma. In contrast, the gas cluster process in the present invention does not use plasma generated by discharge or a carbonaceous material containing hydrogen. Appropriate gas cluster ion irradiation performed in this process can form a conductive carbon film having a large amount of diamond bond component and as a result high hardness without raising the temperature of the base material above 100° C. Accordingly, the present invention is also applicable to a base material made of, for example plastic, of which material properties change at high temperature of 100° C. or higher.

Therefore, the present invention can greatly contribute to the development in the fields of surface treatment applied to probes for use in measurement of electrical properties of semiconductors and electronic component materials, surface treatment applied to separators to be placed between the anode and cathode of fuel cells, and surface treatment applied to cathode electron emission elements.

The invention claimed is:

1. A method for vapor-phase formation of a conductive hard carbon film on a base material under vacuum, the method comprising a step of purifying and/or flattening the base material by irradiating the base material with a gas cluster ion beam; a step of evaporating/vaporizing a carbon film forming material containing a carbonaceous material containing substantially no hydrogen and a borohydride material, allowing the evaporated/vaporized material, which is optionally ionized, to adhere to the surface of the base material, and irradiating the carbon film forming material with a gas cluster ion beam for film formation; and a step of decomposing the borohydride into hydrogen and boron when the gas cluster ions collide against the surface of the base material, allowing the decomposed hydrogen to go out of the conductive hard carbon film, allowing less than or equal to 1 atom percent or less of the hydrogen to remain in the conductive hard carbon film, and allowing the decomposed boron to remain in the conductive hard carbon film.

2. A conductive hard carbon film formed by the method of claim 1, the film having indentation hardness of 35 to 60 GPa and volume resistivity of $1.0\times10^{-4}$ to $1.0\times10^{0}$ Ω·cm.

3. The conductive hard carbon film of claim 2, wherein the borohydride material contains 2 to 18 boron atoms.

4. A method for vapor-phase formation of a conductive hard carbon film on a base material under vacuum, the method comprising a step of purifying and/or flattening the base material by irradiating the base material with a gas cluster ion beam; a step of forming an intermediate layer film by evaporating/vaporizing an intermediate layer film forming material, allowing the evaporated/vaporized material, which is optionally ionized, to adhere to the surface of the base material, and irradiating the intermediate layer film forming material with a gas cluster ion beam; a step of evaporating/vaporizing a carbon film forming material containing a carbonaceous material containing substantially no hydrogen and a borohydride material, allowing the evaporated/vaporized material, which is optionally ionized, to adhere to the surface of the intermediate layer film, and irradiating the carbon film forming material with a gas cluster ion beam for film formation; and a step of decomposing the borohydride into hydrogen and boron when the gas cluster ions collide against the surface of the base material, allowing the decomposed hydrogen to go out of the conductive hard carbon film, allowing less than or equal to 1 atom percent or less of the hydrogen to remain in the conductive hard carbon film, and allowing the decomposed boron to remain in the conductive hard carbon film.

5. A conductive hard carbon film formed by the method of claim 4, wherein the material for forming the intermediate layer film contains at least one kind selected from silicon, chromium, tungsten, titanium, molybdenum and a carbide or nitride thereof.

* * * * *

UNITED STATES PATENT AND TRADEMARK OFFICE
CERTIFICATE OF CORRECTION

PATENT NO. : 9,183,965 B2
APPLICATION NO. : 13/885623
DATED : November 10, 2015
INVENTOR(S) : Teruyuki Kitagawa et al.

It is certified that error appears in the above-identified patent and that said Letters Patent is hereby corrected as shown below:

On the Title Page:

At item (75), line 1, "Himeji (JP);" should be -- Osaka (JP); --.

At item (75), line 2, "Himeji (JP);" should be -- Osaka (JP); --.

Signed and Sealed this
Seventh Day of June, 2016

Michelle K. Lee
*Director of the United States Patent and Trademark Office*